United States Patent [19]
Uda

[11] Patent Number: 4,622,477
[45] Date of Patent: Nov. 11, 1986

[54] LIGHT EMITTING DIODE DRIVER CIRCUIT

[75] Inventor: Yoshihiro Uda, Tokyo, Japan

[73] Assignee: NEC Corporation, Tokyo, Japan

[21] Appl. No.: 673,451

[22] Filed: Nov. 21, 1984

[30] Foreign Application Priority Data

Nov. 24, 1983 [JP] Japan ................... 58-220967

[51] Int. Cl.⁴ ............ H03K 19/14; H03K 3/26; G06G 7/12
[52] U.S. Cl. ............ 307/311; 307/270; 307/490
[58] Field of Search ........... 307/270, 311, 490, 590

[56] References Cited

U.S. PATENT DOCUMENTS 4,063,117 12/1977 Laugesen et al. ............ 307/270
4,404,474 9/1983 Dingwall ............ 307/270
4,533,838 8/1985 Fujita ............ 307/270

Primary Examiner—Stanley D. Miller
Assistant Examiner—B. P. Davis
Attorney, Agent, or Firm—Sughrue, Mion, Zinn, Macpeak, and Seas

[57] ABSTRACT

An LED driver circuit of a digital optical transmitter for an optical fiber data link includes a differential amplifier with emitter coupled transistors, an LED being connected to the collector of one of the emitter coupled transistors. A current source is connected to the common emitters to enable switching of the emitter coupled transistors in response to an input signal. The input signal, a first delayed input signal and a second delayed input signal, are applied to the current source through an OR circuit, to render the current source conductive in response to said input signal, the first delayed input signal or the second delayed input signal. The first delayed input signal and an inverted first delayed input signal switch the emitter coupled transistors when the current source is conductive. As the current source is conductive at the transistor switching times, high speed switching with smooth charging and discharging of the LED junction capacitance is achieved. Further, since the current source turns on and off in response to the input signal current consumption is conserved.

7 Claims, 4 Drawing Figures

LIGHT EMITTING DIODE DRIVER CIRCUIT

BACKGROUND OF THE INVENTION

The present invention relates to a digital optical transmitter for an optical fiber data link and, more particularly, to a driver circuit for driving a light emitting diode which serves as a light source in the optical transmitter.

Practical use of an optical fiber data link began with relatively low speeds on the order of 1 Mb/s and, today, it is extending to speeds as high as several hundreds of Mb/s to provide for a data link between large scale computers. So far as optical transmitters for low speed optical fiber data links are concerned, a light emitting diode (LED) is now predominant as a light source over a semiconductor laser due to the reliability of operation and the simplicity of a driver circuit. In parallel with such a trend, a remarkable development of high-speed response LEDs is under way and it is believed that a high speed optical fiber data link using such an LED as a light source will soon reach a practical stage.

Where a light source for an optical transmitter in an optical fiber data link is implemented by an LED and signal modulation at high speeds above several tens of Mb/s is desired, a driver circuit constructed as shown in FIG. 1 is extensively used (Stewart D. Personick, Optical Fiber Transmission Systems: Circuit For LED Transmitters, pages 47-53, Plenum Press, New York And London, 1981). As shown, the driver circuit includes input terminals 1 and 2 to which input signals having phases inverted relative to each other are applied. Transistors 3 and 4 constitute in combination a differential amplifier. An LED 6 is connected to the collector of transistors 3. A transistor 5 cooperates with resistors R12 and R14 to provide a current source circuit. The reference numeral 7 designates a power source input terminal 7 to which a positive DC voltage is applied. In this construction, the transistors 3 and 4 are alternately turned on and off by an input signal so that smooth charging and discharging occur for the junction capacity of the LED 6. Nevertheless, current consumption by such a driver circuit is undesirably great because either one of the transistors 3 and 4 is turned on with no regard to an input signal pattern and, thereby causes a predetermined current to constantly flow through the transistor 5.

One approach to cut down the power consumption in the above-described circuit is disclosed in Japanese Patent Laid-Open Publication No. 57-31666, published July 6, 1982. The approach consists in applying a clock signal having a predetermined period to the transistor of the current source circuit of the above-described circuit in order to drive a light emitting element only when the clock signal is high level. The problem encountered with the disclosed drive circuit is, however, that it requires the synchronization in advance between the input signal and the clock signal to properly trigger the switching transistor. In other words, it never permits the connection of an asynchronous signal to the input terminal. In addition, since the current source circuit is clocked at a predetermined period, a current flows therethrough even when an input signal is absent, resulting in wasteful current consumption.

SUMMARY OF THE INVENTION

It is therefore an object of the present invention to provide an LED driver circuit which remarkably reduces current consumption while an input signal is absent.

It is another object of the present invention to provide an LED driver circuit which drives an LED at a high speed and, yet, offers output light with a waveform identical with that of an input signal.

Still another object of the present invention is to provide an LED drive circuit which is applicable to any type of input signal.

In accordance with the present invention, there is provided a light emitting diode driver circuit including a differential amplifier having emitter coupled transistors, a light emitting diode (LED) connected to a collector of one of the emitter coupled transistors, and a current source circuit connected to the common by connected emitters of the differential amplifier. The driver circuit comprises a first delay circuit for generating a first delayed signal and a signal opposite in polarity to the first delayed signal by delaying an input signal, a second delay circuit for delaying the first delayed signal, and an OR circuit applied with the input signal, the first delayed signal and an output of the second delay circuit. The first delayed signal and the inverted signal associated therewith respectively are delivered to those sides of the emitter coupled transistors to which the LED is connected and not connected. An output of the OR circuit drives the current source circuit.

A period of time during which the first delayed signal appears is predetermined to be shorter than a conduction period of the current source circuit. In this construction, the emitter coupled transistors for driving the LED switch the current when the current source circuit is conductive, thereby realizing high speed operation.

Further, the conduction period of the current source circuit varies with the input signal and, therefore, hardly any current is allowed to flow through the circuit so long as an input signal is absent.

DETAILED DESCRIPTION OF THE PREFERRED EMBODIMENTS

The present invention will be described in detail with reference to the accompanying drawings.

Figure 1:
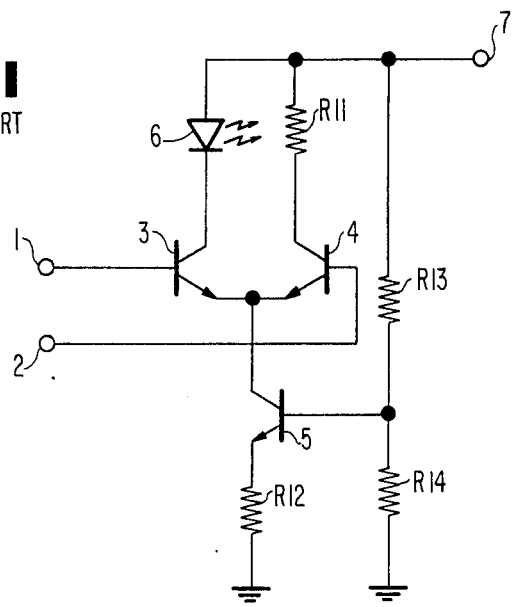
FIG. 1 is a diagram of a prior art LED driver circuit.
Figure 2:
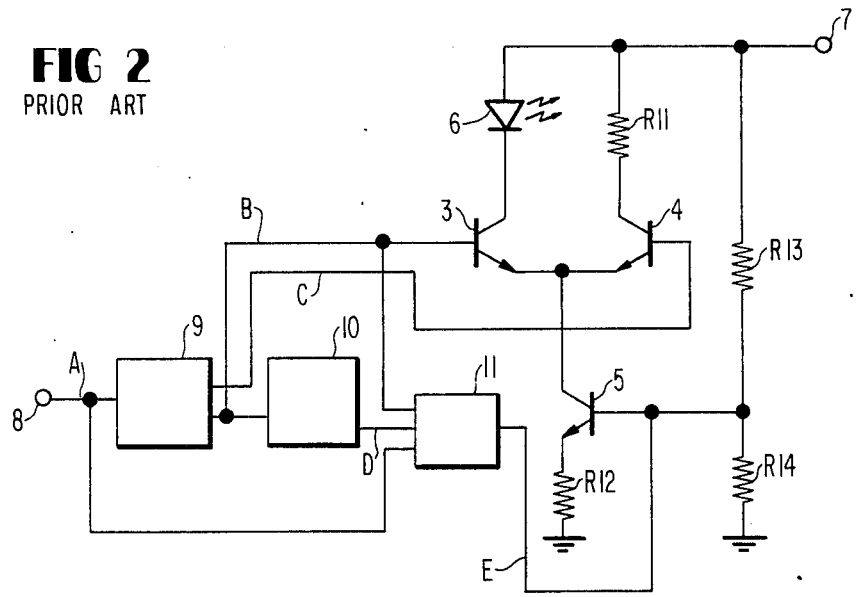
FIG. 2 is a block diagram of an LED driver circuit embodying the present invention.

Referring to FIG. 2, an LED driver circuit embodying the present invention is shown and includes emitter coupled transistors 3 and 4. These transistors 3 and 4 and a transistor 5 in a current source circuit are the same as those of the prior art driver circuit shown in FIG. 1. In accordance with the illustrative embodiment, an input signal to the driver circuit is applied to an input terminal 8. The driver circuit further comprises a first delay circuit 9 connected between the input terminal 8 and the bases of the transistors 3 and 4, a second delay circuit 10 which further delays an output of the first delay circuit and couples to an OR gate 11, which is in turn connected to the base of the transistor 5.

Figure 3:
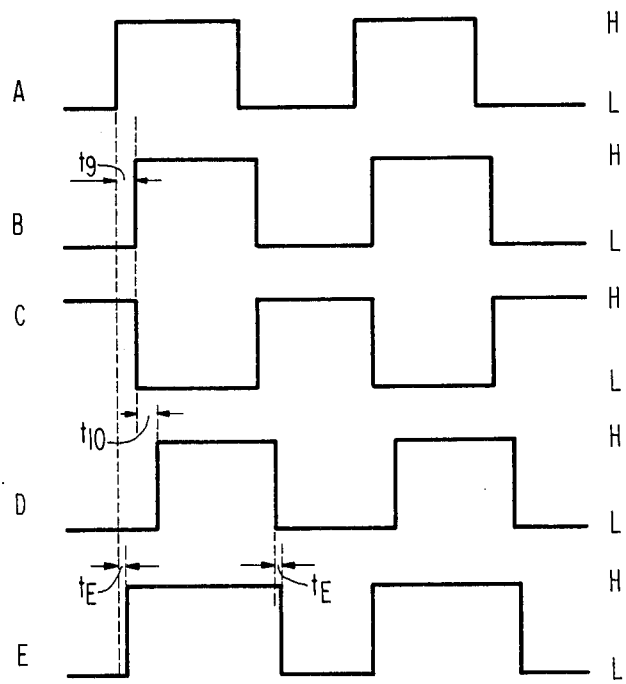
FIG. 3 shows waveforms of signals appearing in essential part of the circuit shown in FIG. 2.

The operation of the driver circuit shown in FIG. 2 will be described with reference also made to FIG. 3, which is a timing chart representative of the states of signal lines A–E of FIG. 2. The signal lines labeled A–E correspond respectively to the signals A–E of FIG. 3. The first delay circuit 9 delays an input signal A applied to the input terminal 8 by a time $t_9$ so as to develop a first delayed signal B and a signal C which is opposite in phase to the signal B. The delayed signal B is routed to the base of the transistor 3 and the inverted delayed signal C to the base of the transistor 4. The delayed signal B is also applied to the second delay circuit 10 to be thereby delayed by a time $t_{10}$, the circuit 10 producing a delayed signal D. The delayed signals B and D and the input signal A are delivered to the OR circuit 11 which then produces an OR signal E. The OR signal E has been delayed by a time $t_E$ by the OR circuit 11. The transistor 5 in the current source circuit is driven by the OR signal E, the transistor 3 by the delayed signal B, and the transistor 4 by the inverted delay signal C. As a result, the source current is allowed to flow through the driver circuit over a period of time between a positive going edge and just after a negative going edge of the input signal A, that is, only when the signal E is kept at a high level.

After the signal E reaches a high level and when a positive-going transition of the first delayed signal B appears, the transistors 3 and 4 switch the current and, when the first delay signal B has become "H (high)" level, the transistor 3 is turned on to activate the LED 6. Meanwhile, while the signal E maintains the high level and after a negative-going transition of the signal B appears, another current switching of the transistors 3 and 4 takes places. Such a current switching promotes smooth charging and discharging for the junction capacitance of the LED 6 and transistors 3 and 4, thereby insuring high-speed operation.

Figure 4:
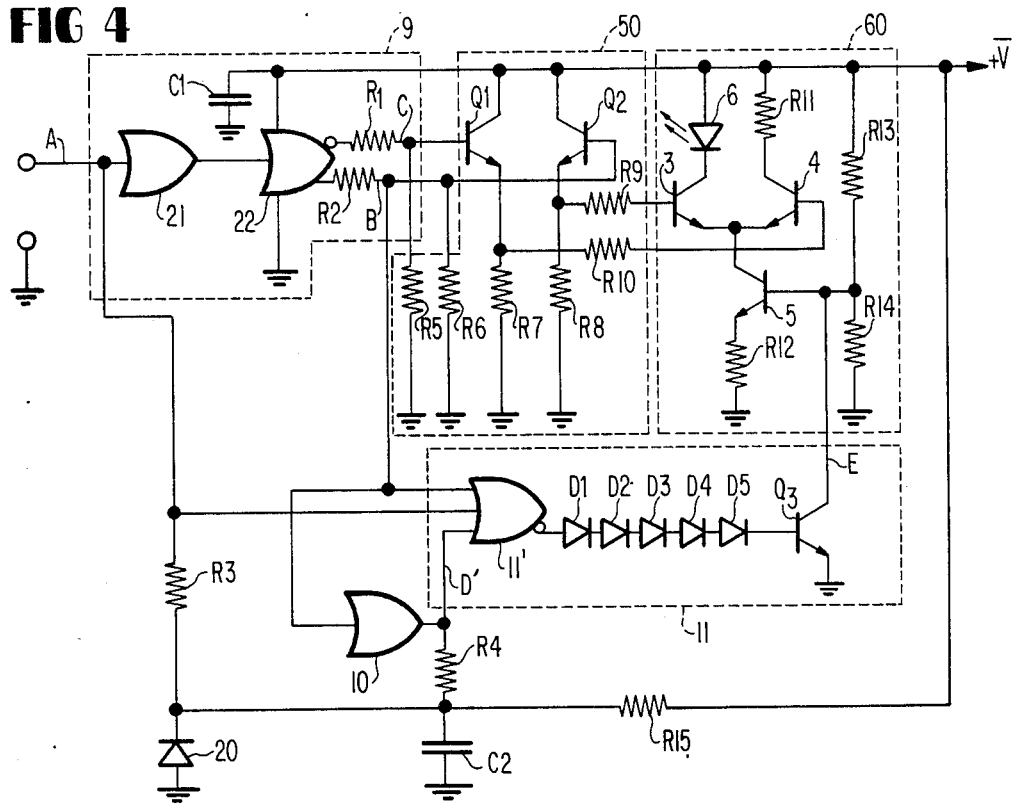
FIG. 4 is a circuit diagram showing details of an embodiment of the present invention.

Referring to FIG. 4, there is shown a circuit in accordance with the present invention which is constructed to drive an LED at a high speed by use of 100 Mb/s NRZ signal as the input signal A. As shown, the circuit includes a first delay circuit 9 for generating a first delayed signal B and an inverted version C of the signal B by delaying the input signal A. A second delay circuit 10, which comprises an OR gate, serves to delay the first delayed signal B. An OR circuit 11 includes an ECL (OR/NOR output) gate 11' and is supplied with the input signal A, the first delayed signal B, and a signal D delayed by an OR gate 10. A level shift circuit 50 is applied with the first delayed signal B and the inverted delayed signal C to shift the DC level. Further included in the circuit of FIG. 4 is a driver circuit 60 which is the same as the driver circuit of FIG. 1.

The circuit of FIG. 4 will be described in relation with the timing chart of FIG. 3.

The first delay circuit 9 comprises an OR gate 21 and a high-speed ECL (OR/NOR) gate 22 and functions to delay the input signal A by a time $t_9$ (ns). The delayed signal is routed through resistors R1 and R2 to the bases of transistors Q1 and Q2 of the level shift circuit 50. Resistors R5 and R6 respectively are connected to the bases of the transistors Q1 and Q2, while resistors R7 and R8 respectively are connected to the emitters of the transistors Q1 and Q2, thereby forming an emitter-follower circuit. The level shift circuit 50 is employed for shifting the DC output level at the gate 22 to the base bias level of the transistors 3 and 4, and realizes high-speed level shifts by means of the emitter-follower circuit.

The OR gate 10 delays the first delayed signal B by a time $t_{10}$ and delivers the resulting signal to the ECL gate 11'. Resistors R3 and R4, a Zener diode ZD, a capacitor C2 and a resistor R15 which are connected to the input side of the gate 11' are adapted to set an input level of the gate 11'. Although the gate 11' serves the function of a NOR circuit, since the high level of its output is the source voltage, a series connection of diodes D1–D5 is employed to level it down to thereby adjust the voltage level applied to the base of a transistor Q3. A signal E appearing at the collector of the transistor Q3 is delivered to the base of a transistor 5. The signal E is delayed by the delay time $t_E$ assigned to the OR circuit 11 relative to the input signal.

Therefore, as the OR circuit 11 detects the signals A, B and D, the signal E rises upon the lapse of the time $t_E$ after the rise of the input signal A, whereby the transistor 5 is turned on. After the signal E reaches a high level and when a negative-going transition of the signal B appears, the transistors 3 and 4 switch the current. When the signal B becomes "H" level, the transistor 3 is rendered conductive to energize the LED 6. Meanwhile, while the signal E maintains the high level and after a negative-going transition of the signal B appears, the current switching of the transistors 3 and 4 takes place again.

Since the current is switched during the conduction of the transistor 5 as described above, charging and discharging for the junction capacitance of the LED 6 occurs smoothly to accomplish high-speed operation.

While setting of the delay times $t_9$ and $t_{10}$ has been implemented by OR gates in the above-described embodiment, they may be replaced with other logical gates or even by coaxial cables. Since coaxial cables have a delay time of 5 ns/m, they are satisfactorily appliable to a driver circuit with a 100 Mb/s or high operating speed if their length is adequately adjusted. Further, as for a driver circuit with an operating speed lower than several tens of Mb/s, the delay may be implemented by a commercially available delay line.

In summary, it will be seen that the present invention provides an LED driver circuit which turns on and off a current supply circuit in response to on and off of an input signal and, thereby, remarkably cuts down current consumption during a period in which the input signal is absent, while producing an optical output waveform identical with the waveform of the input signal. In addition, since the current source circuit is activated in advance during the current switching of the emitter coupled transistors, charging and discharging for the junction capacitance of an LED and a drive transistor associated therewith is effected smoothly even at the time of high speed modulation. This eliminates deterioration of the operating speed and, thereby, furnishes the LED driver circuit with significant utility.

What is claimed is:

1. A light emitting diode drive circuit comprising:
   a differential amplifier having emitter coupled transistors, a collector of one of the emitter coupled transistors being connected to a light emitting diode;
   a current source circuit connected to a common emitter of the emitter coupled transistors;
   a first delay circuit responsive to an input signal for generating a first delay signal and an inverted signal in phase with the first delay signal;
   a second delay circuit responsive to the first delay signal for producing a second delay signal; and an OR circuit for providing the logical sum signal which goes to a first level just before said first delay signal goes to said first level and which goes down to a second level just after said first delay signal goes down to the second level;

the first delay signal and the inverted signal associated therewith driving the emitter coupled transistors, the logical sum signal driving the current source circuit.

2. A light emitting diode driver circuit as claimed in claim 1, including means for enabling switching of the emitter coupled transistors when the current source circuit is conductive.

3. A light emitting diode driver circuit as claimed in claim 1, wherein each of the first and second delay circuits comprises a logical gate circuit.

4. A light emitting diode driver circuit as claimed in claim 1, wherein each of the first and second delay circuits comprises a coaxial cable.

5. A light emitting diode driver circuit as claimed in claim 1, wherein each of the first and second delay circuits comprises a delay line.

6. A light emitting diode driver circuit including a differential amplifier having emitter coupled transistors, a light emitting diode connected to a collector of one of the emitter coupled transistors of the differential amplifier, and a current source circuit connected to a common emitter of the emitter coupled transistors, said light emitting diode driver circuit comprising:

a first circuit means responsive to an input signal for generating first and second driving signals each opposite in phase, the first and second driving signals being coupled to the base of the emitter coupled transistor whose collector is coupled to the light emitting diode and the base of the other emitter coupled transistor, respectively; and a second circuit means responsive to the input signal for generating a current source circuit driving signal which goes to a first level just before the first driving signal goes to said first level and which goes to a second level just after the first driving signal goes to said second level, the current source circuit driving signal rendering said current source conductive when at said first level.

7. A light emitting diode driver circuit as claimed in claim 6, wherein said current source circuit includes a transistor, said first level of said current source circuit driving signal being a high level, said second level of said current source circuit driving signal being a low level, said current source circuit transistor being connected to receive said current source circuit driving signal and to conduct in response to the high level of said current source circuit driving signal.

* * * * *

UNITED STATES PATENT AND TRADEMARK OFFICE
CERTIFICATE OF CORRECTION

PATENT NO. : 4,622,477

DATED : November 11, 1986

INVENTOR(S) : Yoshihiro UDA

It is certified that error appears in the above-identified patent and that said Letters Patent is hereby corrected as shown below:

Column 1, Line 35, delete "transistors", and insert therefor

--transistor--.

Column 2, Line 15, delete "common by", and insert therefor

--commonly--.

Signed and Sealed this

Seventh Day of April, 1987

Attest:

DONALD J. QUIGG

Attesting Officer

Commissioner of Patents and Trademarks